US011222918B1

(12) United States Patent
Kim et al.

(10) Patent No.: US 11,222,918 B1
(45) Date of Patent: Jan. 11, 2022

(54) IMAGE SENSOR

(71) Applicant: Samsung Electronics Co., Ltd., Suwon-si (KR)

(72) Inventors: Sungchul Kim, Hwaseong-si (KR); Jaeho Kim, Seoul (KR); Uihui Kwon, Hwaseong-si (KR); Seoksan Kim, Suwon-si (KR); Minwoong Seo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/320,873

(22) Filed: May 14, 2021

(30) Foreign Application Priority Data

Aug. 10, 2020 (KR) .......................... 10-2020-0100102

(51) Int. Cl.
*H01L 27/146* (2006.01)
*H04N 5/359* (2011.01)

(52) U.S. Cl.
CPC .. *H01L 27/14654* (2013.01); *H01L 27/14609* (2013.01); *H04N 5/3592* (2013.01)

(58) Field of Classification Search
CPC ........ H01L 27/14654; H01L 27/14609; H04N 5/3592
See application file for complete search history.

(56) References Cited

U.S. PATENT DOCUMENTS

| | | | |
|---|---|---|---|
| 7,332,786 B2 | 2/2008 | Altice, Jr. et al. | |
| 7,851,798 B2 | 12/2010 | Ladd | |
| 8,395,194 B2 | 3/2013 | Yokoyama et al. | |
| 8,748,954 B2 | 6/2014 | Mayer | |
| 9,640,577 B2 | 5/2017 | Oh et al. | |
| 10,084,007 B2 | 9/2018 | Lee | |
| 10,192,918 B2 * | 1/2019 | Lin | H01L 27/14689 |
| 10,468,460 B2 | 11/2019 | Ishii et al. | |
| 10,886,312 B2 * | 1/2021 | Na | H01L 31/1037 |
| 2010/0134668 A1 | 6/2010 | Park et al. | |
| 2019/0371838 A1 | 12/2019 | Takahashi et al. | |

* cited by examiner

*Primary Examiner* — Seung C Sohn
(74) *Attorney, Agent, or Firm* — Muir Patent Law, PLLC

(57) ABSTRACT

An image sensor comprising a substrate including an upper surface and a lower surface opposite each other and extending in a first direction and a second direction, a first isolation region in the substrate and apart from the upper surface in a third direction perpendicular to the first direction and second direction, the first isolation region defining a boundary of a photoelectric conversion region, a second isolation region in the substrate and extending in the third direction from the lower surface to the first isolation region, a plurality of transistors on the upper surface in the photoelectric conversion region, and a photoelectric conversion device in the substrate in the photoelectric conversion region. The first isolation region includes a potential well doped with an impurity of a first conductivity type, and the second isolation region includes an insulating material layer.

20 Claims, 13 Drawing Sheets

IMAGE SENSOR

CROSS-REFERENCE TO RELATED APPLICATION

This application is based on and claims priority under 35 U.S.C. § 119 to Korean Patent Application No. 10-2020-0100102, filed on Aug. 10, 2020, in the Korean Intellectual Property Office, the disclosure of which is incorporated by reference herein in its entirety.

BACKGROUND

Aspects of the inventive concept relate to an image sensor, and more particularly, to an image sensor having a structure suppressing the blooming phenomenon.

Image sensors convert optical images into electrical signals. Commonly used image sensors include a charge coupled device (CCD)-type image sensor and a complementary metal oxide semiconductor (CMOS)-type image sensor (CIS). These image sensors include a plurality of pixels in a two-dimensional matrix form, and each pixel outputs an image signal from light energy. Each of the plurality of pixels accumulates photo charges corresponding to an amount of light incident through a photoelectric conversion device, and outputs a pixel signal based on the accumulated photo charges. In general, an insulation layer is formed between each of the plurality of pixels, and insulates the spaces between the pixels by using a relatively large potential barrier as compared with the photoelectric conversion device. However, when excessive photo charges generated in the photoelectric conversion device by very strong light cross the potential barrier, the excessive photo charges may act as noise in an adjacent photoelectric conversion device, and this phenomenon is referred to as the blooming phenomenon.

SUMMARY

Aspects of the inventive concept provide an image sensor having a structure suppressing a blooming phenomenon by forming a potential well and an insulating material layer between photoelectric conversion devices.

The issue to be solved by the technical idea of the inventive concept is not limited to the above-mentioned issues, and other matters not mentioned may be clearly understood by those of ordinary skill in the art from the following description.

According to an aspect of the inventive concept, there is provided an image sensor including: a substrate including an upper surface and a lower surface opposite each other and extending in a first direction and a second direction; a first isolation region in the substrate and apart from the upper surface in a third direction perpendicular to the first direction and the second direction, the first isolation region defining a boundary of a photoelectric conversion region; a second isolation region in the substrate and extending in the third direction from the lower surface to the first isolation region; a plurality of transistors on the upper surface in the photoelectric conversion region; and a photoelectric conversion device in the substrate in the photoelectric conversion region, wherein the first isolation region includes a potential well doped with an impurity of a first conductivity type, and the second isolation region includes an insulating material layer.

According to another aspect of the inventive concept, there is provided an image sensor including: a plurality of unit pixels extending in a first direction and second direction perpendicular to the first direction; a plurality of photoelectric conversion regions constituting each of the plurality of unit pixels; and an isolation region having a grid shape and insulating spaces between the plurality of photoelectric conversion regions, wherein the isolation region includes: a first isolation region doped with an impurity of a first conductivity type; and a second isolation region including an insulating material layer.

According to another aspect of the inventive concept, there is provided an image sensor including: a substrate including an upper surface and a lower surface extending in a first direction and a second direction perpendicular to the first direction, a plurality of photoelectric conversion regions arranged in the substrate; a first isolation region apart from the upper surface in a third direction, perpendicular to the first direction and the second direction, between the plurality of photoelectric conversion regions and arranged in a grid shape in the substrate, the first isolation region being doped with an impurity of a first conductivity type; a second isolation region in a grid shape in the substrate and extending from the lower surface to the first isolation region in the third direction to separate the plurality of photoelectric conversion regions, the second isolation region including an insulating material layer; a plurality of contact regions each extending from the upper surface in the third direction and electrically connected to the first isolation region; a plurality of transistors on the upper surface of the substrate in each of the plurality of photoelectric conversion regions; a transfer gate on the upper surface of the substrate in each of the plurality of photoelectric conversion regions; and a photoelectric conversion device inside the substrate in each of the plurality of photoelectric conversion regions.

BRIEF DESCRIPTION OF THE DRAWINGS

Embodiments of the inventive concept will be more clearly understood from the following detailed description taken in conjunction with the accompanying drawings in which.

Figure 6:
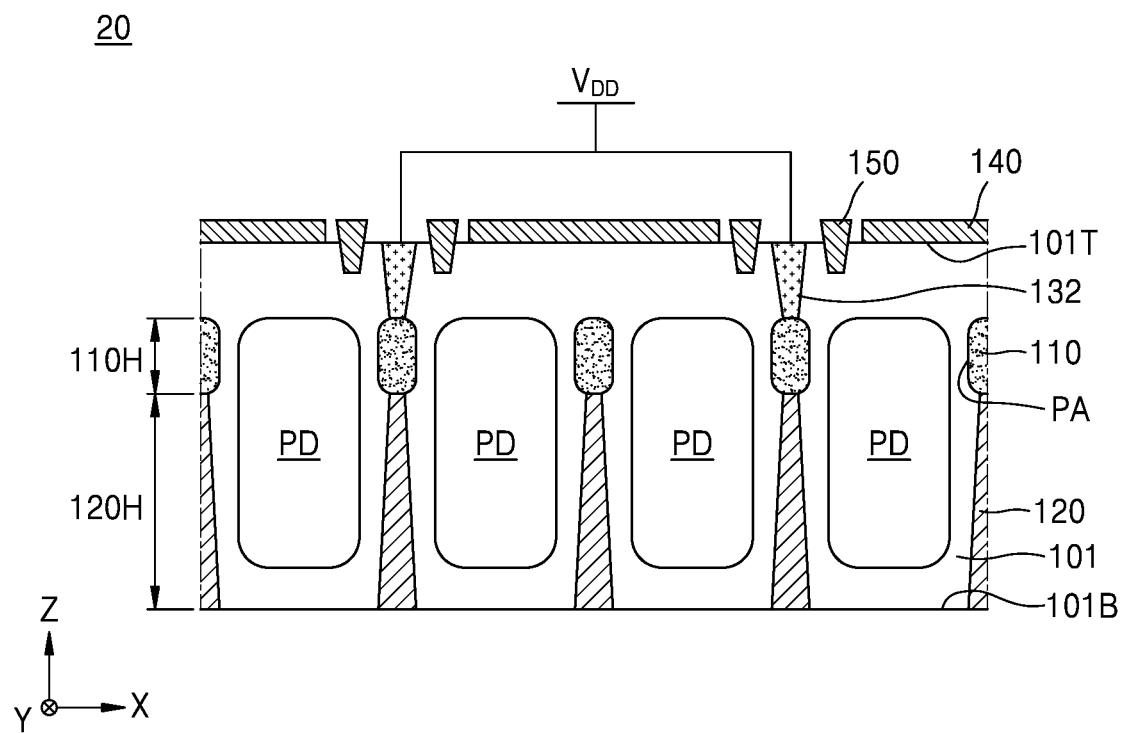
Figure 7:
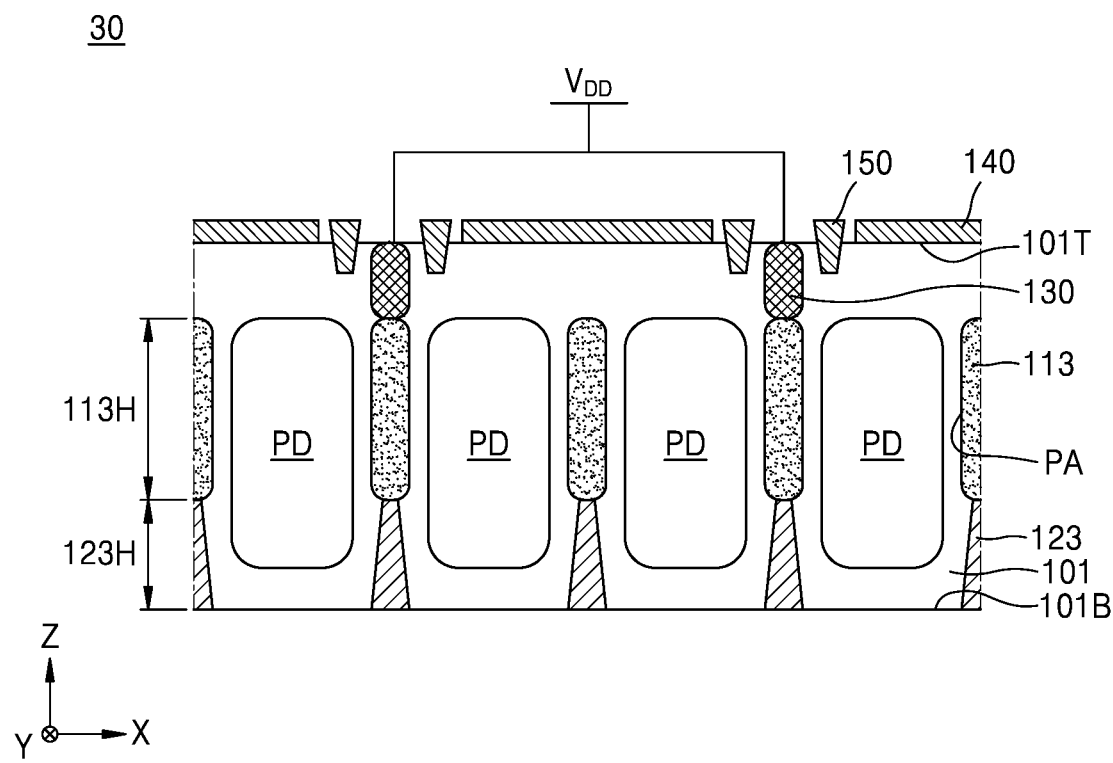
Figure 8:
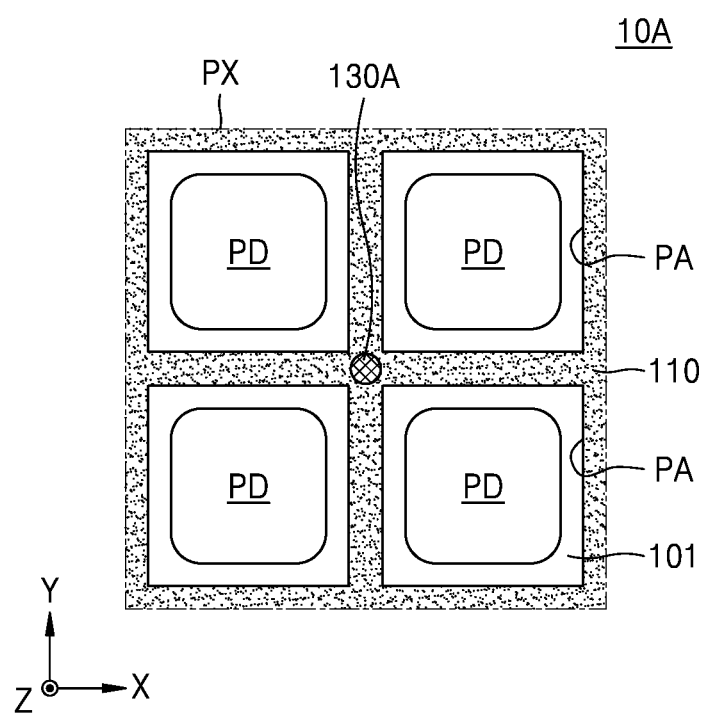
Figure 9:
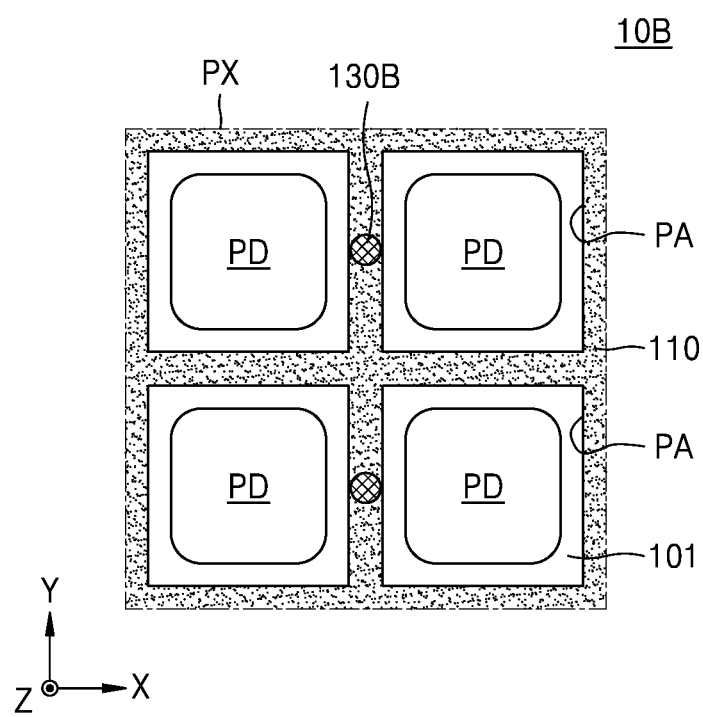
Figure 10:
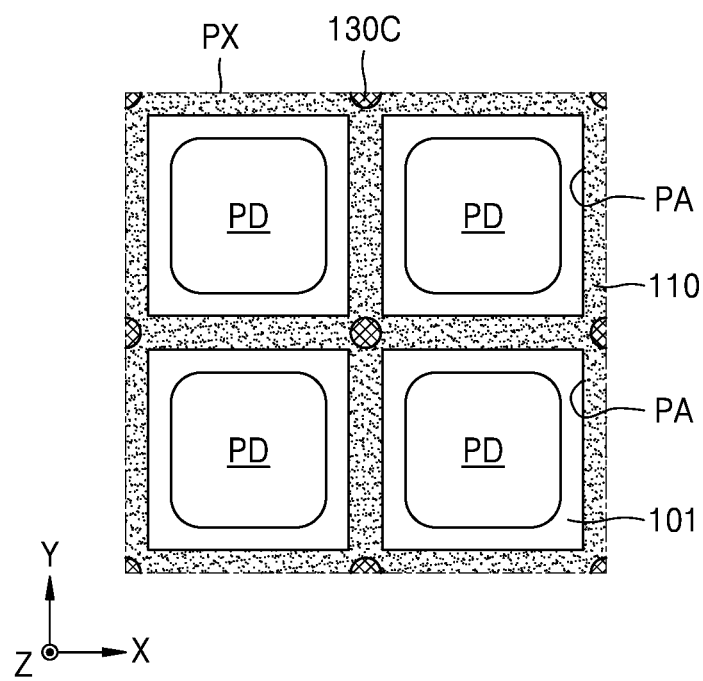
Figure 11:
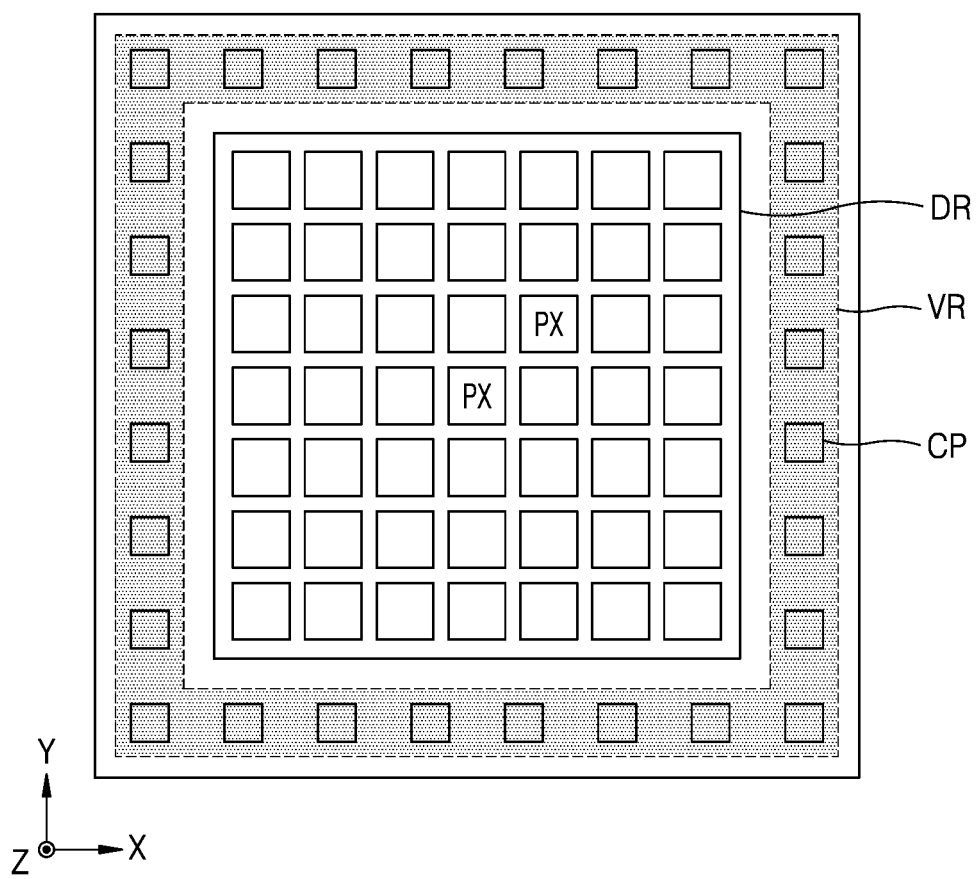
Figure 12:
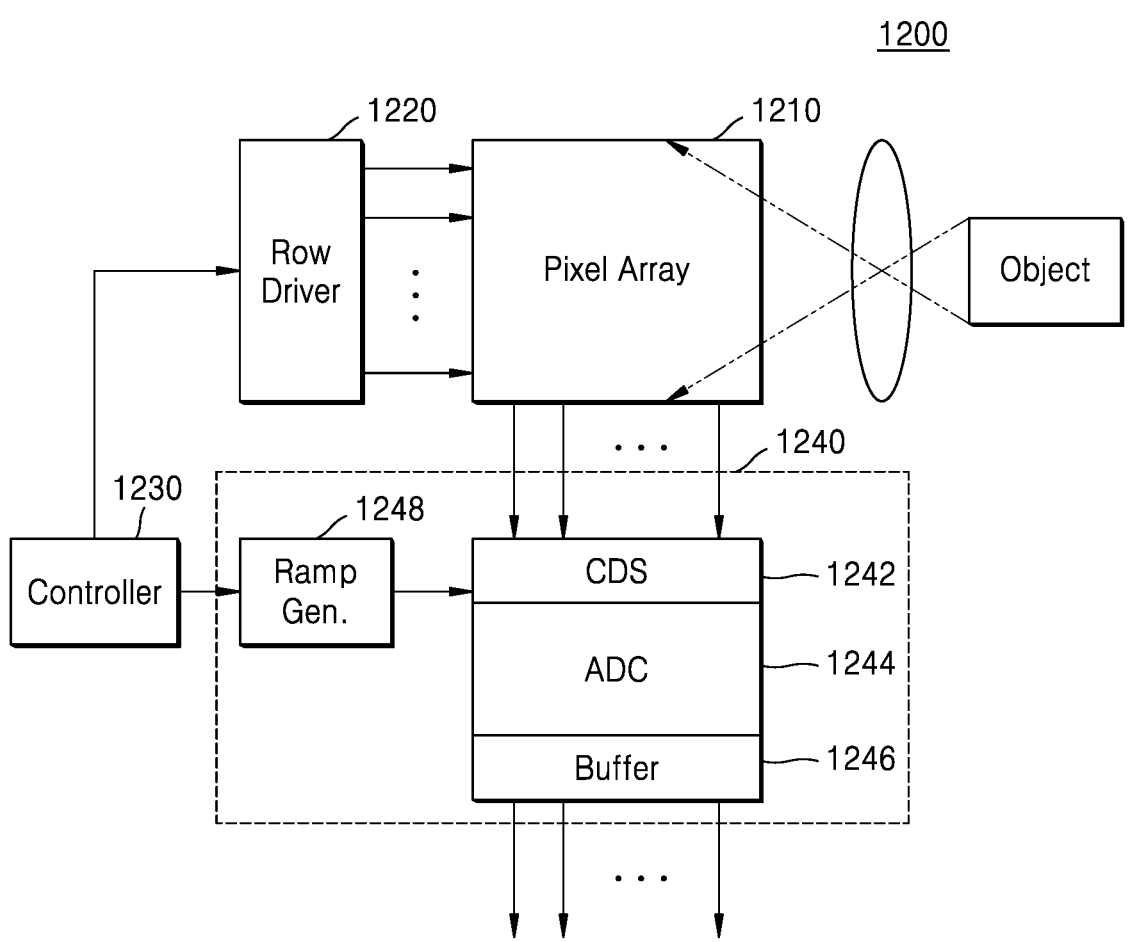
Figure 13:
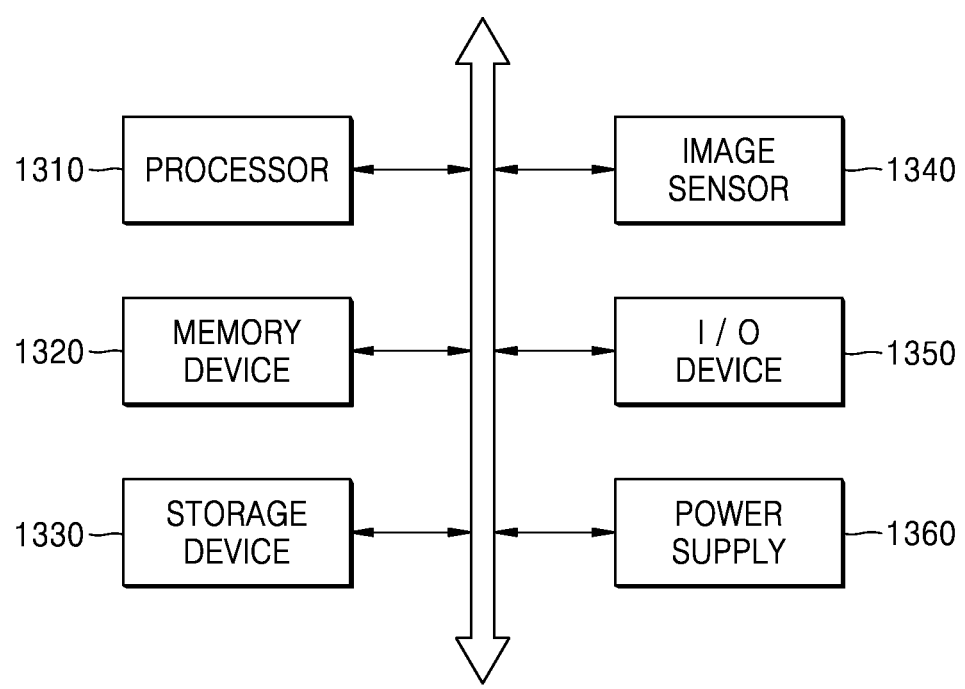

Each of FIGS. 6 and 7 is a side cross-sectional view of an image sensor, according to another example embodiment of the inventive concept;

Each of FIGS. 8 through 10 is a planar cross-sectional view of an image sensor, according to another example embodiment of the inventive concept;

FIG. 11 is a plan view of a pixel array of an image sensor, according to an embodiment of the inventive concept;

FIG. 12 is a block diagram of a configuration of an image sensor, according to an embodiment of the inventive concept; and FIG. 13 is a block diagram of an electronic system including an image sensor, according to an embodiment of the inventive concept.

DETAILED DESCRIPTION OF THE EMBODIMENTS

Hereinafter, embodiments of the inventive concept are described in detail with reference to the accompanying drawings.

Figure 1:
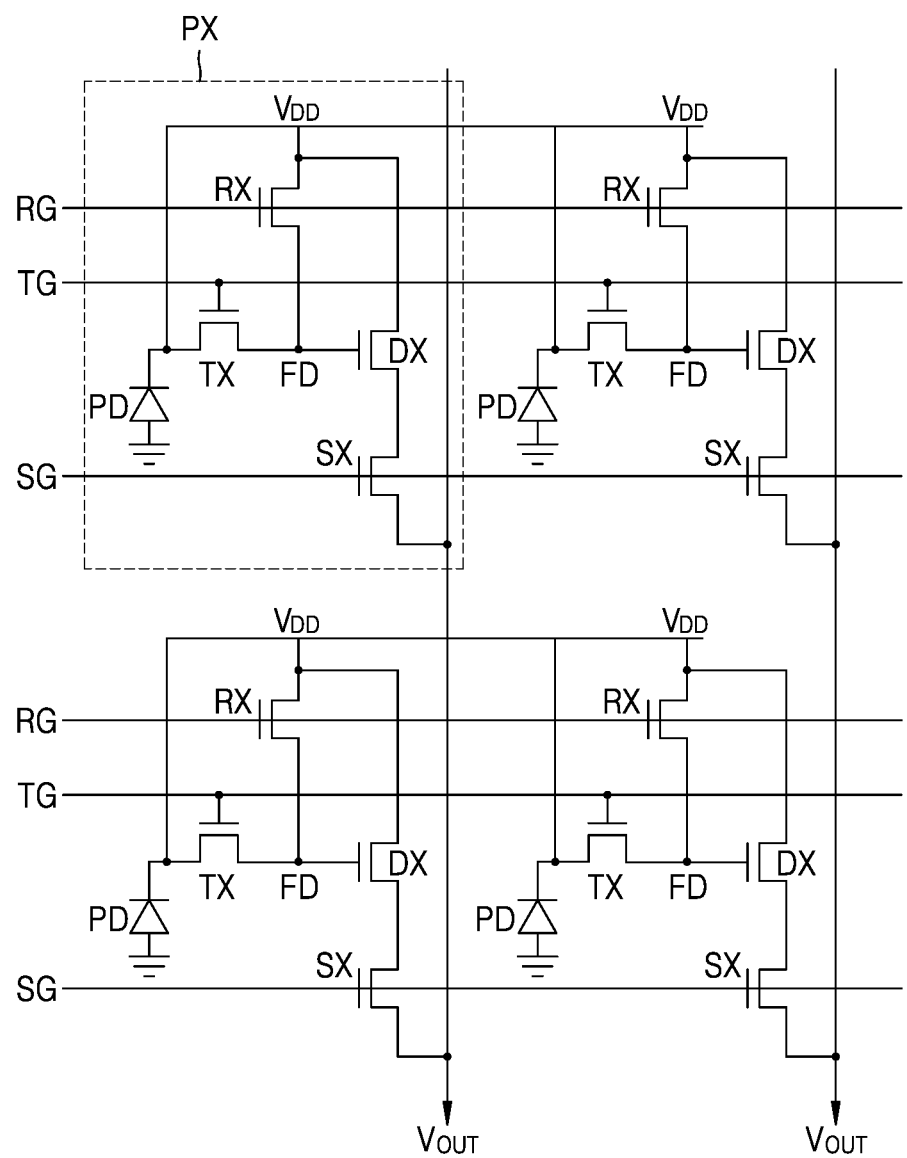
FIG. 1 is a circuit diagram of a pixel cell array of an image sensor, according to an embodiment of the inventive concept.

FIG. 1 is a circuit diagram of a pixel cell array of an image sensor, according to an embodiment of the inventive concept.

Referring to FIG. 1, unit pixels PX including transfer transistors TX and logic transistors (for example, RX, SX, and DX) are illustrated in an array form.

The unit pixel PX may be arranged in plurality. In some embodiments, a plurality of unit pixels PX may be in a matrix form. In this case, the logic transistors may include a reset transistor RX, a select transistor SX, and a drive transistor DX (or a source follower transistor). The reset transistor RX may include a reset gate RG, and the select transistor SX may include a select gate SG. In addition, the transfer transistor TX may include a transfer gate TG.

The unit pixel PX may include a photoelectric conversion device PD and a floating diffusion region FD. The photoelectric conversion device PD may generate and accumulate photo charges in proportion to an amount of light incident from the outside, and may include a photodiode, a phototransistor, a photogate, and a pinned photodiode (PPD), or a combination thereof.

The transfer gate TG may transfer photo charges generated by the photoelectric conversion device PD to the floating diffusion region FD. The floating diffusion region FD may receive the photo charges generated by the photoelectric conversion device PD and store the received photo charges in an accumulation manner. The drive transistor DX may be controlled according to an amount of photo charges accumulated in the floating diffusion region FD.

The reset transistor RX may periodically reset the photo charges accumulated in the floating diffusion region FD. A drain electrode of the reset transistor RX may be connected to the floating diffusion region FD, and a source electrode of the reset transistor RX may be connected to a power voltage $V_{DD}$.

When the reset transistor RX is turned on, the power voltage $V_{DD}$ connected to the source electrode of the reset transistor RX may be transferred to the floating diffusion region FD. When the reset transistor RX is turned on, the photo charges accumulated in the floating diffusion region FD may be discharged, and the floating diffusion region FD may be reset.

The drive transistor DX may be connected to a current source (not illustrated) outside the unit pixel PX, may function as a source follower buffer amplifier, may amplify a potential change in the floating diffusion region FD, and may output the amplified potential change to an output line $V_{OUT}$.

The select transistor SX may select the plurality of unit pixels PX in units of rows, and when the select transistor SX is turned on, the power voltage $V_{DD}$ may be transferred to the source electrode of the drive transistor DX.

According to example aspects of the inventive concept, a potential well may be formed between one photoelectric conversion device PD and another photoelectric conversion device PD, and may be designed so that the power voltage $V_{DD}$ is supplied to the potential well. Accordingly, excessive photo charges generated in the photoelectric conversion device PD by very strong light may be drained into the potential well. A detailed description thereof is described later.

Figure 2:
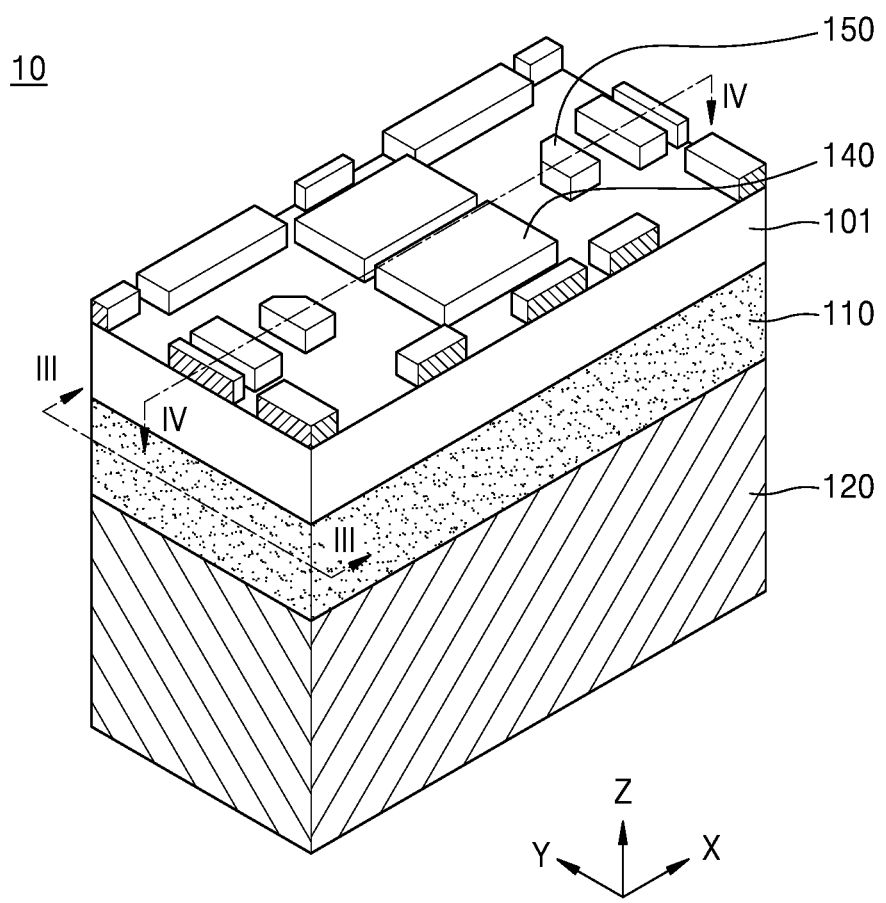
FIG. 2 is a perspective view of an image sensor, according to an embodiment of the inventive concept.
Figure 3:
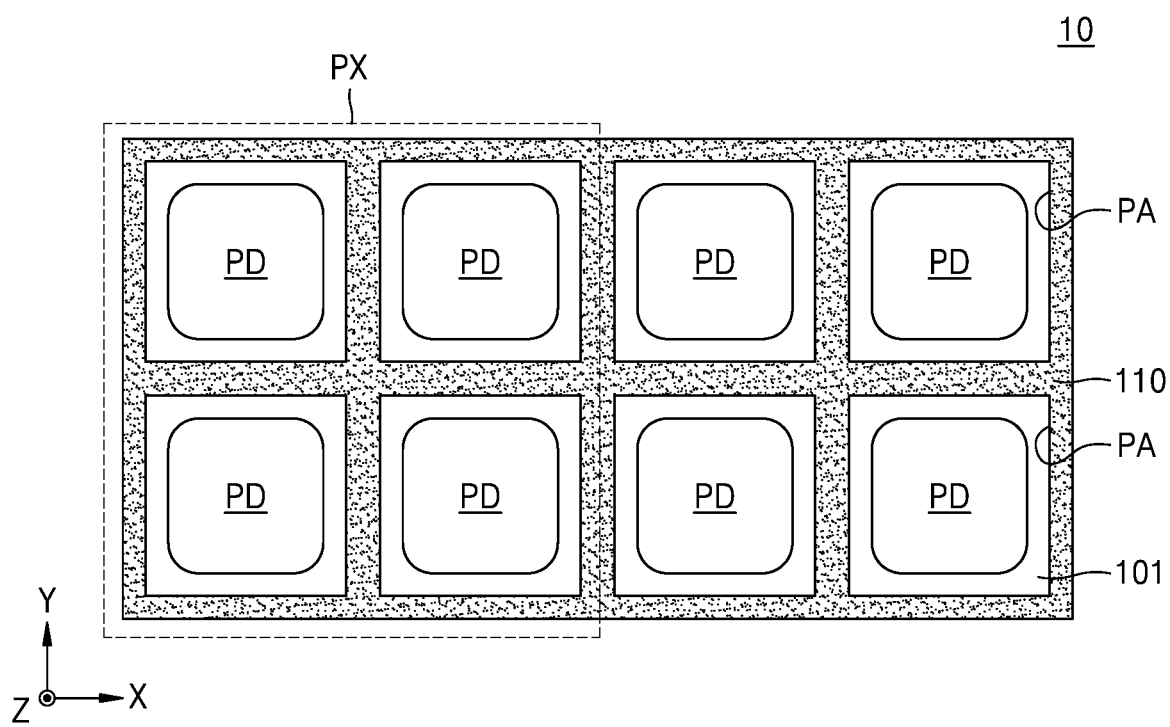
FIG. 3 is a planar cross-sectional view of an image sensor taken along line in FIG. 2.
Figure 4:
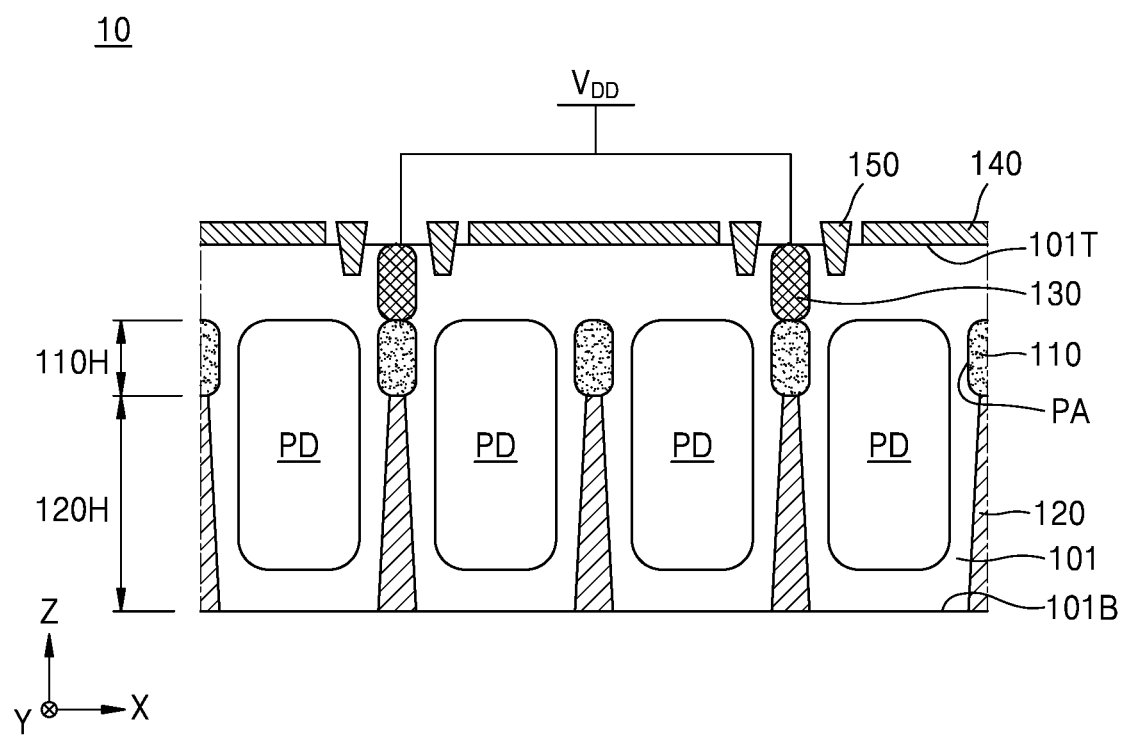
FIG. 4 is a side cross-sectional view of an image sensor taken along line IV-IV in FIG. 2.

FIG. 2 is a perspective view of an image sensor, according an embodiment of the inventive concept, FIG. 3 is a planar cross-sectional view of an image sensor taken along line in FIG. 2, and FIG. 4 is a side cross-sectional view of an image sensor taken along line IV-IV in FIG. 2.

Referring to FIGS. 2 through 4 together, an image sensor 10 including a substrate 101, a first isolation region 110 and a second isolation region 120 in the substrate 101 and defining a boundary of a photoelectric conversion region PA, a contact region 130, and a photoelectric conversion device PD in the photoelectric conversion region PA is illustrated.

The substrate 101 may include a semiconductor substrate. The substrate 101 may include an upper surface 101T and a lower surface 101B opposite each other. The substrate 101 may include a P-type semiconductor substrate. For example, the substrate 101 may include a P-type silicon (Si) substrate. In some embodiments, the substrate 101 may include or may be formed of a P-type bulk substrate and a P-type or an N-type epitaxial growth layer grown thereon. In other embodiments, the substrate 101 may include or may be formed an N-type bulk substrate and a P-type or an N-type epitaxial growth layer grown thereon. Alternatively, the substrate 101 may include or may be formed of an organic plastic substrate.

The plurality of unit pixels PX may be on the substrate 101. For example, in a planar cross-sectional view, the plurality of unit pixels PX may be in a matrix form, and a plurality of photoelectric conversion regions PA may be in each unit pixel PX constituting the plurality of unit pixels PX.

The plurality of photoelectric conversion regions PA may be regions for generating electric signals from light incident through the substrate 101. For example, the plurality of photoelectric conversion regions PA may be regions for generating electrical signals from visible light or infrared rays incident through the substrate 101, but the technical idea of the inventive concept is not limited thereto. The plurality of photoelectric conversion regions PA may be on the substrate 101 in a first direction (X direction) and a second direction (Y direction) perpendicular to each other.

The plurality of photoelectric conversion devices PD may generate and accumulate photo charges in proportion to the amount of light incident from the outside, and may include a photodiode, a phototransistor, a photogate, a pinned photodiode, or a combination thereof. The plurality of photoelectric conversion devices PD may have a first conductivity type, and for example, the first conductivity type may include an N type. In this case, the substrate 101 may have a second conductivity type, and for example, the second conductivity type may include a P type. The plurality of photoelectric conversion devices PD may be inside the substrate 101 at a certain depth in a third direction (Z direction) perpendicular to both the first direction (X direction) and the second direction (Y direction).

The plurality of photoelectric conversion regions PA may be defined in the substrate 101 by the first and second isolation regions 110 and 120. For example, the first and second isolation regions 110 and 120 may be between one of the plurality of photoelectric conversion regions PA and a photoelectric conversion region PA adjacent thereto to thereby form a boundary between adjacent photoelectric conversion regions PA. One photoelectric conversion region PA and another photoelectric conversion region PA adjacent thereto may be physically and electrically isolated by the first and second isolation regions 110 and 120. The first and second isolation regions 110 and 120 may be between each of the plurality of photoelectric conversion regions PA in a matrix form, and may have a lattice shape or a mesh shape in a planar cross-sectional view.

The first isolation region 110 may be apart from an upper surface 101T of the substrate 101, and may have a certain first length 110H in the third direction (Z direction). For example, the first isolation region 110 may not be in contact with the upper surface 101 T of the substrate 101. The first isolation region 110 may include a potential well doped with a high concentration of impurities of the first conductivity type (that is, the N type). In a planar cross-sectional view, all sides of the photoelectric conversion device PD may be surrounded and enclosed by the first isolation region 110. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "contacts" or "in contact with" another element, there are no intervening elements present at the point of contact.

The first isolation region 110 may be formed by a plurality of ion implantation processes and heat treatment processes. The ion implantation process and the heat treatment process may be performed so that the lowermost surface of the first isolation region 110 contacts the uppermost surface of the second isolation region 120.

The second isolation region 120 may have a certain second length 120H in the third direction (Z direction) from a lower surface 101B of the substrate 101 to the first isolation region 110. The second isolation region 120 may be formed in a tapered shape in which a width of the second isolation region 120 decreases as the second isolation region 120 extends away from the lower surface 101B of the substrate 101 in the third direction (Z direction).

In some embodiments, the first length 110H of the first isolation region 110 may be less than the second length 120H of the second isolation region 120. For example, the first length 110H of the first isolation region 110 may be about 0.5 µm to about 1 µm, and the second length 120H of the second isolation region 120 may be about 1.5 µm to about 2 µm, but the embodiment is not limited thereto. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In addition, a value obtained by adding the first length 110H of the first isolation region 110 and the second length 120H of the second isolation region 120 may be greater than a value of a length of the photoelectric conversion device PD in the third direction (Z direction). For example, the entire side surface of the photoelectric conversion device PD in the third direction (Z direction) may be surrounded by the first and second isolation regions 110 and 120.

The second isolation region 120 may include an insulating liner (not illustrated) conformally formed on an internal wall of the substrate 101, and an insulating material layer filling the inside of the insulating liner. For example, the second isolation region 120 may include or may be formed of, as the insulating material layer, silicon oxide, silicon nitride, silicon oxynitride, SiCN, or a low dielectric constant material such as SiCO. The insulating material layer may be formed in a trench of a deep trench isolation (DTI) pattern.

The contact region 130 may be electrically connected to the first isolation region 110 from the upper surface 101T of the substrate 101 in the third direction (Z direction). The contact region 130 may be doped with an impurity of the first conductivity type (that is, the N type). The contact region 130 may be in contact with a portion of the first isolation region 110. Accordingly, the contact region 130 may be electrically connected to the first isolation region 110 such that the contact region 130 may provide a path through which the power voltage $V_{DD}$ supplies a voltage to the first isolation region 110. As used herein, items described as being "electrically connected" are configured such that an electrical signal can be passed from one item to the other. Therefore, a passive electrically conductive component (e.g., a wire, pad, internal electrical line, etc.) physically connected to an electrically insulative material of an electrically insulative component (e.g., a prepreg layer of a printed circuit board, an electrically insulative adhesive connecting two devices, an electrically insulative isolation layer, an electrically insulative underfill or mold layer, etc.) is not electrically connected to that component.

In some embodiments, the contact region 130 may be formed by a plurality of ion implantation processes and heat treatment processes. The ion implantation process and the heat treatment process may be performed so that the lowermost surface of the contact region 130 contacts the uppermost surface of the first isolation region 110.

A plurality of transistors 140 may be on the upper surface 101T of the substrate 101. In the side cross-sectional view, the plurality of transistors 140 are illustrated in a single plate shape, but this is for convenience of description, and a region in which the plurality of transistors 140 are arranged is schematically illustrated.

In some embodiments, the plurality of transistors 140 may include the transfer transistor (SX, refer to FIG. 1) transferring photo charges generated in the photoelectric conversion region PA to the floating diffusion region (FD, refer to FIG. 1), the reset transistor (RX, refer to FIG. 1) periodically resetting the photo charges stored in the floating diffusion region FD, the drive transistor (DX, refer to FIG. 1) performing a role of a source follower buffer amplifier and buffering a signal according to photo charges stored in the floating diffusion region FD, and the select transistor (SX, refer to FIG. 1) performing switching and addressing for selecting the unit pixel PX. However, the types of the plurality of transistors 140 are not limited thereto.

In other embodiments, the plurality of transistors 140 may include various types of circuits for controlling the unit pixel PX. For example, the plurality of transistors 140 may provide a constant signal to each photoelectric conversion region PA, or may control an output signal in each photoelectric conversion region PA. For example, the plurality of transistors 140 may constitute various types of logic circuits by using a timing generator, a row decoder, a row driver, a correlated double sampler, an analog to digital converter, a latch, a column decoder, or the like, but the embodiment is not limited thereto. A detailed description thereof is described later.

The transfer gate 150 may have a recess gate type extending from the upper surface 101T of the substrate 101 to the inside of the substrate 101. However, a shape of the transfer gate 150 is not limited thereto. A transfer gate insulating layer (not illustrated) may be between the substrate 101 and the transfer gate 150. For example, because the transfer gate 150 is formed in the recess gate type, a portion of the transfer gate insulating layer may extend to the inside of the substrate 101.

In a planar cross-sectional view, the plurality of transistors 140 may be on the upper surface 101T of the substrate 101 to overlap a portion of the photoelectric conversion device PD. In some embodiments, the plurality of transistors 140 may be over the plurality of photoelectric conversion regions PA to overlap the plurality of photoelectric conversion elements PD. In addition, although not illustrated, the first and second isolation regions 110 and 120 may be formed inside the substrate 101 and the plurality of transistors 140 and the transfer gate 150 may be formed in or arranged on a substrate in contact with the substrate 101.

An image sensor may convert an optical image into an electrical signal. Commonly used image sensors may include a CCD-type image sensor and a CIS. Such an image sensor may include a plurality of unit pixels in a two-dimensional matrix form, and each unit pixel may output an image signal from light energy. Each of the plurality of unit pixels may accumulate photo charges corresponding to an amount of light incident through a photoelectric conversion device, and output a pixel signal based on accumulated photo charges.

In a general image sensor, spaces between unit pixels may be insulated by using a potential barrier relatively greater than the photoelectric conversion device. However, when excessive photo charges generated in the photoelectric conversion device by a very strong light cross the potential barrier, the excessive photo charges may act as noise in an adjacent photoelectric conversion device, and this phenomenon may be referred to as a blooming phenomenon. To address the blooming phenomenon, a technique of forming a through insulating layer penetrating a substrate between photoelectric conversion devices has been used. However, because recent image sensors require a plurality of transistors, when the through insulating layer is formed on the substrate, there may be an issue that an area is reduced in which a transistor is arranged.

To address this issue, the image sensor 10 according to the technical idea of the inventive concept may include the first isolation region 110 functioning as the potential well between one photoelectric conversion device PD and one photoelectric conversion device PD. The image sensor 10 according to example aspects of the inventive concept may suppress the blooming phenomenon by forming the first isolation region 110 and the second isolation region 120 including an insulating material layer in a lattice shape.

In addition, the image sensor 10 according to example aspects of the inventive concept may prevent a dark current that occurs between an upper portion of a deep trench isolation structure and the substrate 101, by using the potential well of the first isolation region 110.

As a result, the image sensor 10 according to example aspects of the inventive concept may provide a clear and distinct image signal, because noise is reduced and sensitivity is improved, based on suppression of the blooming phenomenon.

Figure 5:
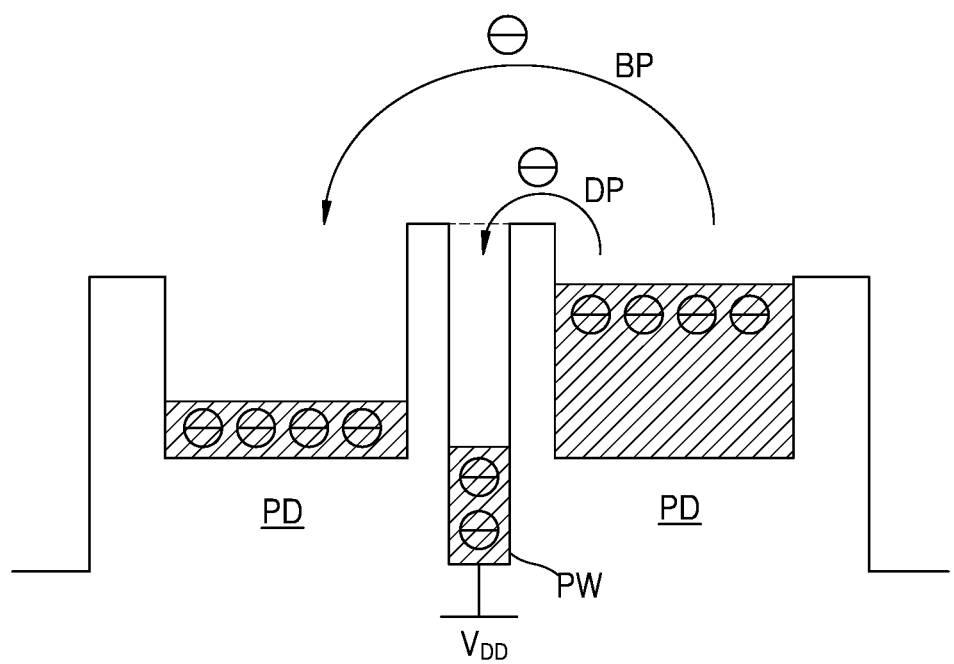
FIG. 5 is a graph illustrating a potential barrier of an image sensor, according to an embodiment of the inventive concept.

FIG. 5 is a graph illustrating a potential barrier of the image sensor 10, according to an embodiment of the inventive concept.

Referring to FIG. 5, photo charges may be accumulated in the photoelectric conversion device PD that is surrounded by a region having a high potential barrier.

In general, the photo charges may be accumulated in the photoelectric conversion device PD, but the photo charges that are not accumulated by the photoelectric conversion device PD due to very strong light may overflow over the potential barrier, and may become noise to an adjacent photoelectric conversion device PD. This phenomenon is illustrated as a first path BP in FIG. 5.

In the image sensor 10 according to example aspects of the inventive concept, even though the photo charges excessively generated in the photoelectric conversion element PD overflows and crosses over the potential barrier, because the overflowed photo charges are drained by the power voltage $V_{DD}$ applied to a potential well PW, an influence on the adjacent photoelectric conversion element PD may be suppressed. This phenomenon is illustrated as a second path DP in FIG. 5.

In a general image sensor without the second path DP, the photo charges may overflow through the first path BP, and the blooming phenomenon may occur. However, since the image sensor 10 of the inventive concept has the second path DP, a phenomenon in which the photo charges move through the first path BP may be significantly reduced. Accordingly, in the image sensor 10 according to example aspects of the inventive concept, the blooming phenomenon may be suppressed by the first isolation region (110, refer to FIG. 4) functioning as the potential well PW.

Although not illustrated, the potential well PW may also suppress the occurrence of the dark current, by draining electrons generated between the upper portion of the deep trench isolation structure and a Si substrate through the second path DP.

In some embodiments, the level of the power voltage $V_{DD}$ may vary based on an operating state of the image sensor 10. For example, the level of the power supply voltage $V_{DD}$ may vary based on a noise signal, and as the noise signal increases, it may be preferred to increase the level of the power supply voltage $V_{DD}$. As the level of the power voltage $V_{DD}$ increases, the noise signal removal capability increases, but the level of the power voltage $V_{DD}$ may need to be varied within a range in which the potential well PW is maintained.

Each of FIGS. 6 and 7 is a side cross-sectional view of an image sensor, according to another example embodiment of the inventive concept.

Most of the components constituting image sensors 20 and 30, and materials constituting the components described below may be substantially the same as or similar to those described with reference to FIGS. 2 through 4. Accordingly, for convenience of explanation, differences from the image sensor 10 described above are mainly described.

Referring to FIG. 6, an image sensor 20 including the substrate 101, the first isolation region 110 and a second isolation region 120 in the substrate 101 and defining the boundary of the photoelectric conversion region PA, a contact region 132, and the photoelectric conversion device PD in the photoelectric conversion region PA is illustrated.

In the image sensor 20 of the present embodiment, the contact region 132 may be electrically connected to the first isolation region 110 from the upper surface 101T of the substrate 101 in the third direction (Z direction). The contact region 132 may include a metal material layer having electrical conductivity. For example, the contact region 132 may include or may be formed of Cu, W, Ta, Ti, Co, Mn, Al, or a combination thereof, but is not limited thereto.

The contact region 132 may contact a portion of the first isolation region 110. In addition, the contact region 132 may provide a path through which a power voltage $V_{DD}$ supplies a voltage to the first isolation region 110.

In some embodiments, the contact region 132 may be formed by a process of etching a trench to a certain depth in the substrate 101 and a process of forming a metal material layer filling the trench. The process of etching the trench may be performed by adjusting the certain depth so that the lowermost surface of the contact region 132 contacts the uppermost surface of the first isolation region 110.

The contact region 132 may have a certain length from the upper surface 101T of the substrate 101 to the first isolation region 110 in the third direction (Z direction). The contact region 132 may have a tapered shape in which a width thereof becomes less as the contact region 132 extends away from the upper surface 101T of the substrate 101 in the third direction (Z direction). Accordingly, in a side cross-sectional view, the contact region 132 and the second isolation region 120 in combination may have a shape similar to an hourglass with the first isolation region 110 therebetween.

Referring to FIG. 7, the image sensor 30 including the substrate 101, a first isolation region 113 and a second isolation region 123 in the substrate 101 and defining the boundary of the photoelectric conversion region PA, the contact region 130, and the photoelectric conversion device PD in the photoelectric conversion region PA is illustrated.

In the image sensor 30 of the present embodiment, the boundary of the plurality of photoelectric conversion regions PA may be defined in the substrate 101 by the first and second isolation regions 113 and 123. The first and second isolation regions 113 and 123 may be between one of the plurality of photoelectric conversion regions PA and a photoelectric conversion region PA adjacent thereto. One photoelectric conversion region PA and another photoelectric conversion region PA adjacent thereto may be physically and electrically isolated by the first and second isolation regions 113 and 123.

The first isolation region 113 may be apart from an upper surface 101T of the substrate 101, and may have a certain third length 113H in the third direction (Z direction). For example, the first isolation region 113 may not contact the upper surface 101T of the substrate 101. The first isolation region 113 may include a potential well doped with a high concentration of impurities of the first conductivity type (that is, the N type).

The first isolation region 113 may be formed by a plurality of ion implantation processes and heat treatment processes. The ion implantation process and the heat treatment process may be performed so that the lowermost surface of the first isolation region 113 contacts the uppermost surface of the second isolation region 123.

The second isolation region 123 may have a certain fourth length 123H in the third direction (Z direction) from a lower surface 101B of the substrate 101 to the first isolation region 113. The second isolation region 123 may have a tapered shape in which a width thereof becomes less as the second isolation region 123 extends away from the lower surface 101B of the substrate 101 in the third direction (Z direction).

In some embodiments, the third length 113H of the first isolation region 113 may be greater than the fourth length 123H of the second isolation region 123. For example, the third length 113H of the first isolation region 113 may be about 1.5 μm to about 2 μm, and the fourth length 123H of the second isolation region 123 may be about 0.5 μm to about 1 μm, but the embodiment is not limited thereto.

In addition, a value obtained by adding the third length 113H of the first isolation region 113 and the fourth length 123H of the second isolation region 123 may be greater than a value of the length of the photoelectric conversion device PD in the third direction (Z direction). In other words, the entire side surface of the photoelectric conversion device PD in the third direction (Z direction) may be surrounded by the first and second isolation regions 113 and 123.

Each of FIGS. 8 through 10 is a planar cross-sectional view of an image sensor, according to another example embodiment of the inventive concept.

Most of the components constituting image sensors 10A, 10B, and 10C, and materials constituting the components described below may be substantially the same as or similar to those described with reference to FIGS. 2 through 4. Accordingly, for convenience of explanation, differences from the image sensor 10 described above are mainly described.

Referring to FIG. 8, an image sensor 10A including the substrate 101, the first isolation region 110 in the substrate 101 and defining the boundary of the photoelectric conversion regions PA, the contact region 130A, and the photoelectric conversion devices PD in the photoelectric conversion regions PA is illustrated.

In the image sensor 10A of the present embodiment, the contact region 130A may be electrically connected to the first isolation region 110. The contact region 130A may be doped with impurities of the first conductivity type (that is, the N type). The contact region 130A may contact a portion of the first isolation region 110.

One contact region 130A may be formed on the first isolation region 110 corresponding to the center region of four adjacent photoelectric conversion regions PA. In other words, the contact region 130A may be formed at a grid point where the first isolation region 110 between two adjacent photoelectric conversion regions PA in the first direction (X direction) and the first isolation region 110 between two adjacent photoelectric conversion regions PA in the second direction (Y direction) cross each other. In other words, one contact region 130A may be provided in one unit pixel PX.

Referring to FIG. 9, an image sensor 10B including the substrate 101, the first isolation region 110 in the substrate 101 and defining the boundary of the photoelectric conversion regions PA, two contact regions 130B, and the photoelectric conversion devices PD in the photoelectric conversion regions PA is illustrated.

In the image sensor 10B of the present embodiment, the contact region 130B may be electrically connected to the first isolation region 110. The contact region 130B may be doped with impurities of the first conductivity type (that is, the N type). The contact region 130B may contact a portion of the first isolation region 110.

One contact region 130B may be formed on the first isolation region 110 corresponding to the center region of two adjacent photoelectric conversion regions PA. In other words, the contact region 130B may be formed on the first isolation region 110 between two photoelectric conversion regions PA adjacent to each other in the first direction (X direction). In other words, two contact regions 130B may be provided in one unit pixel PX.

Referring to FIG. 10, an image sensor 10C including the substrate 101, the first isolation region 110 in the substrate 101 and defining the boundary of the photoelectric conversion regions PA, four contact regions 130C, and the photoelectric conversion devices PD in the photoelectric conversion regions PA is illustrated.

In the image sensor 10C of the present embodiment, the contact region 130C may be electrically connected to the first isolation region 110. The contact region 130C may be doped with impurities of the first conductivity type (that is, the N type). The contact region 130C may contact a portion of the first isolation region 110.

One contact region 130C may be formed on the first isolation region 110 at a region corresponding to each of four corners of one photoelectric conversion region PA. In other words, the contact region 130C may be formed at all grid points where the first isolation region 110 between two adjacent photoelectric conversion regions PA in the first direction (X direction) and the first isolation region 110 between two adjacent photoelectric conversion regions PA in the second direction (Y direction) cross each other. In other words, the equivalent of four contact regions 130C may be in one unit pixel PX. For example, as illustrated in FIG. 10C, some of the contact regions 130c may be divided into portions across more than one unit pixel PX.

FIG. 11 is a plan view of a pixel array of an image sensor 1100, according to an embodiment of the inventive concept.

Referring to FIG. 11, the image sensor 1100 may include a device region DR in which the plurality of unit pixels PX are arranged, and an electrode region VR surrounding the device region DR.

In the image sensor 1100 according to the present embodiment, the plurality of unit pixels PX may be in a matrix form. The plurality of unit pixels PX may include logic transistors. The logic transistors may include the reset transistor (RX, refer to FIG. 1), the select transistor (SX, refer to FIG. 1), and the drive transistor (DX, refer to FIG. 1). The reset transistor RX may include the reset gate (RG, refer to FIG. 1), the select transistor SX may include the select gate (SG, refer to FIG. 1), and the transfer transistor TX may include the transfer gate (TG, refer to FIG. 1).

Each of the plurality of unit pixels PX may include the photoelectric conversion device (PD, refer to FIG. 1) and the floating diffusion region (FD, refer to FIG. 1). The photoelectric conversion device PD may generate and accumulate photo charges in proportion to the amount of light incident from the outside.

The electrode region VR is illustrated to surround all of the device regions DR, but the layout of the image sensor 1100 is only an example, and various modifications may be possible within the scope of the technical idea of the inventive concept.

In the device region DR, the plurality of unit pixels PX may be in rows and columns. In addition, the electrode region VR may include the plurality of unit pixels PX and a conductive pad CP electrically connected to a periphery circuit, and the conductive pad CP may function as a connection terminal providing power and signals from the outside to circuits included in the plurality of unit pixels PX and the periphery circuit.

The image sensor 1100 may include characteristics of the image sensors 10, 10A, 10B, 10C, 20, and 30 described above. In other words, the image sensor 1100 according to example aspects of the inventive concept may provide a clear and distinct image signal because noise is reduced and sensitivity is improved, based on suppression of the blooming phenomenon.

FIG. 12 is a block diagram of a configuration of an image sensor 1200, according to an embodiment of the inventive concept.

Referring to FIG. 12, the image sensor 1200 may include a pixel array 1210, a controller 1230, a row driver 1220, and a pixel signal processor 1240.

The image sensor 1200 may include at least one of the image sensors 10, 10A, 10B, 10C, 20, and 30 described above.

The pixel array 1210 may include a plurality of unit pixels PX arranged two-dimensionally, and each unit pixel PX may include the photoelectric conversion device PD. The photoelectric conversion device PD may absorb light to generate photo charges, and an electrical signal (or an output voltage) according to the generated photo charges may be provided to the pixel signal processor 1240 via a signal line. The unit pixels PX included in the pixel array 1210 may provide one output voltage at a time in row units, and accordingly, the unit pixels PX belonging to one row of the pixel array 1210 may be simultaneously activated by a select signal that is output by the row driver 1220. The unit pixel PX belonging to the selected row may provide the output voltage, corresponding to the absorbed light, to an output line of a corresponding column.

The controller 1230 may control the row driver 1220 so that the pixel array 1210 absorbs light to accumulate the photo charges, or temporarily store the accumulated photo charges, and outputs an electrical signal corresponding to the stored photo charges to the outside thereof. In addition, the controller 1230 may control the pixel signal processor 1240 to measure an output voltage provided by the pixel array 1210.

The pixel signal processing unit 1240 may include a correlated double sampler (CDS) 1242, an analog to digital converter (ADC) 1244, and a buffer 1246. The CDS 1242 may sample and hold the output voltage provided by the pixel array 1210.

The CDS 1242 may double-sample a certain noise level and a level of the generated output voltage, and output a level corresponding to a difference therebetween. In addition, the CDS 1242 may receive ramp signals generated by a ramp signal generator 1248, compare the ramp signals with each other, and output a result of comparison.

The ADC 1244 may convert an analog signal corresponding to the level received from the CDS 1242 into a digital signal. The buffer 1246 may latch the digital signal, and the latched digital signal may be sequentially output to the outside of the image sensor 1200 and transferred to an image processor (not illustrated).

FIG. 13 is a block diagram of an electronic system 1300 including an image sensor 1340, according to an embodiment of the inventive concept.

Referring to FIG. 13, the electronic system 1300 may include a processor 1310, a memory device 1320, a storage device 1330, the image sensor 1340, an input/output (I/O) device 1350, and a power device 1360.

Even though not illustrated in FIG. 13, the electronic system 1300 may further include ports for communicating with video cards, sound cards, memory cards, USB devices, or the like, or other electronic systems.

The processor 1310 may perform a particular calculation or task. For example, the processor 1310 may include a microprocessor or a central processing unit (CPU). The processor 1310 may be connected to the memory device 1320, the storage device 1330, and the I/O device 1350 via an address bus, a control bus, and a data bus to perform communication. In some embodiments, the processor 1310 may also be connected to an expansion bus such as a peripheral component interconnect (PCI) bus.

The memory device 1320 may store data required for an operation of the electronic system 1300. The storage device 1330 may include a solid state drive (SSD), a hard disk drive (HDD), and/or a memory card, etc.

The I/O device 1350 may include input devices such as a keyboard, a keypad, and a mouse, and output devices such as a printer and a display. The power supply 1360 may supply an operating voltage required for the operation of the electronic system 1300.

The image sensor 1340 may be connected to the processor 1310 via the buses described above or other communication links to perform communication. The image sensor 1340 may include at least one of the image sensors 10, 10A, 10B, 10C, 20, and 30 described above.

While the inventive concept has been particularly shown and described with reference to embodiments thereof, it will be understood that various changes in form and details may be made therein without departing from the spirit and scope of the following claims.

What is claimed is:

1. An image sensor comprising:
   a substrate including an upper surface and a lower surface opposite each other and extending in a first direction and a second direction;
   a first isolation region in the substrate and apart from the upper surface in a third direction perpendicular to the first direction and the second direction, the first isolation region defining a boundary of a photoelectric conversion region;
   a second isolation region in the substrate and extending in the third direction from the lower surface to the first isolation region;
   a plurality of transistors on the upper surface in the photoelectric conversion region; and
   a photoelectric conversion device in the substrate in the photoelectric conversion region,
   wherein the first isolation region comprises a potential well doped with an impurity of a first conductivity type, and
   the second isolation region comprises an insulating material layer.

2. The image sensor of claim 1, wherein, along a planar view of the upper surface, all sides of the photoelectric conversion device are surrounded and enclosed by the first isolation region.

3. The image sensor of claim 1, wherein the impurity of the first conductivity type comprises an N-type impurity.

4. The image sensor of claim 1, wherein the second isolation region has a tapered shape in which a width thereof decreases as the second isolation region extends in the third direction away from the lower surface, and
   the second isolation region is formed in a trench of a deep trench isolation pattern.

5. The image sensor of claim 1, further comprising a contact region electrically connected to the first isolation region and extending from the upper surface in the third direction.

6. The image sensor of claim 5, wherein the contact region is doped with the impurity of the first conductivity type.

7. The image sensor of claim 5, wherein the contact region comprises a conductive material layer.

8. The image sensor of claim 1, wherein the first isolation region functions as a drain of photo charges overflowed from the photoelectric conversion device.

9. The image sensor of claim 1, wherein a first length of the first isolation region in the third direction is less than a second length of the second isolation region in the third direction.

10. The image sensor of claim 1, wherein, when viewed from a plane parallel to the first direction, the plurality of transistors overlap a portion of the photoelectric conversion device.

11. An image sensor comprising:
    a plurality of unit pixels extending in a first direction and second direction perpendicular to the first direction;
    a plurality of photoelectric conversion regions constituting each of the plurality of unit pixels; and
    an isolation region having a grid shape and insulating spaces between the plurality of photoelectric conversion regions,
    wherein the isolation region comprises:
    a first isolation region doped with an impurity of a first conductivity type; and
    a second isolation region comprising an insulating material layer.

12. The image sensor of claim 11, further comprising a plurality of contact regions electrically connected to the first isolation region and in contact with the first isolation region in a third direction perpendicular to the first direction and second direction.

13. The image sensor of claim 12, wherein the plurality of contact regions are at intersections where portions in the first direction and portions in the second direction of the first isolation region cross each other.

14. The image sensor of claim 12, wherein the plurality of contact regions are apart from each other in the first direction or the second direction.

15. The image sensor of claim 12, wherein the plurality of contact regions are configured to apply a voltage to the first isolation region.

16. An image sensor comprising:
    a substrate comprising an upper surface and a lower surface extending in a first direction and a second direction perpendicular to the first direction;
    a plurality of photoelectric conversion regions arranged in the substrate;
    a first isolation region apart from the upper surface in a third direction perpendicular to the first direction and the second direction, between the plurality of photoelectric conversion regions and arranged in a grid shape in the substrate, the first isolation region being doped with an impurity of a first conductivity type;
    a second isolation region in a grid shape in the substrate, and extending from the lower surface to the first isolation region in the third direction to separate the plurality of photoelectric conversion regions, the second isolation region comprising an insulating material layer;
    a plurality of contact regions each extending from the upper surface in the third direction and electrically connected to the first isolation region;
    a plurality of transistors on the upper surface of the substrate in each of the plurality of photoelectric conversion regions;
    a transfer gate on the upper surface of the substrate in each of the plurality of photoelectric conversion regions; and
    a photoelectric conversion device inside the substrate in each of the plurality of photoelectric conversion regions.

17. The image sensor of claim 16, wherein a first length of the first isolation region in the third direction is about 0.5 µm to about 1 µm, and
    a second length of the second isolation region in the third direction is about 1.5 µm to about 2 µm.

18. The image sensor of claim 16, wherein the plurality of contact regions apply a voltage to the first isolation region, and
    the first isolation region functions as a drain of photo charges overflowed from the photoelectric conversion device.

19. The image sensor of claim 16, wherein the plurality of contact regions are doped with the impurity of the first conductivity type, and the impurity of the first conductivity type comprises an N-type impurity.

20. The image sensor of claim 16, wherein the plurality of contact regions comprise a conductive material layer.

* * * * *